United States Patent [19]

Schmidt et al.

[11] 4,191,963

[45] Mar. 4, 1980

[54] BUILT-IN NOTCHED CHANNEL MOS-FET TRIODES FOR HIGH FREQUENCY APPLICATION

[75] Inventors: Pierre E. Schmidt, Estado Miranda, Venezuela; Mukunda B. Das, State College, Pa.

[73] Assignee: Instituto Venezolano de Investigaciones Cientificas (IVIC), Estado Miranda, Venezuela

[21] Appl. No.: 962,765

[22] Filed: Nov. 21, 1978

[51] Int. Cl.² .......................................... H01L 29/78
[52] U.S. Cl. ........................................ 357/23; 357/4; 357/55; 357/68
[58] Field of Search ........................... 357/23, 4, 55, 68

[56] References Cited

U.S. PATENT DOCUMENTS 4,084,175  4/1978  Ouyang .................................... 357/55

Primary Examiner—Edward J. Wojciechowicz
Attorney, Agent, or Firm—Browdy and Neimark

[57] ABSTRACT

A novel built-in notched channel MOS-FET device with an effective channel length smaller than the effective channel length of conventional built-in channel MOS-FET devices. The device comprises an insulating substrate, a semiconductor layer with two n+-type regions separated by an n-type region, insulation over the semiconductor region, with an opening in each n+-type semiconductor region for metal contacts, a notch in the n-type semiconductor region, at least half of the notch being in the n-type region and touching the boundary between one n+-type semiconductor region and the n-type semiconductor region, and a metal contact above the notch, all of the metal contacts functioning as electrodes.

19 Claims, 18 Drawing Figures

BUILT-IN NOTCHED CHANNEL MOS-FET TRIODES FOR HIGH FREQUENCY APPLICATION

FIELD OF THE INVENTION

The invention relates to the field of built-in notched channel MOS-FET devices with high frequency applications.

BACKGROUND OF THE INVENTION

The conventional inversion type MOS-FET triode has several characteristics which limit its high frequency response. These include:

(a) The existence of a gate to drain overlap capacitance.

(b) The mobility of the carriers in the inversion layer is limited by surface scattering effects to roughly the half of its bulk value.

(c) Conventional photolithographic techniques restrict practical channel lengths to the order of 5μm or longer.

Drawbacks (a) and (b) can be remedied by using a built-in channel with an offset gate structure, that is, a gate structure which is not located in the center of the triode. Such a device is provided by first growing an epitaxial layer of semiconductor material upon an insulating substrate. If the epitaxial layer is an n-type semiconductor material, n+-type semiconductor source and drain regions are formed by techniques such as a solid-state diffusion, so that an n-type semiconductor channel is disposed between two n+-type semiconductor regions. The gate area is only partially metallized in order to avoid overlapping with the drain region. In this way the gate-to-drain overlap capacitance is minimized. The above described device functions as an ordinary built-in channel MOS-FET device. The minimum length L', of the n-type semiconductor channel is determined essentially by the photolithographic process and will be of the order of 5 μm. In conclusion the conventional offset gate built-in channel MOS-FET does not have drawbacks (a) and (b). However, the effective channel length is still long (5 μm) and limits the operation of a built-in channel MOS-FET at high frequencies.

SUMMARY OF THE INVENTION

It is an object of the present invention to overcome the disadvantages of the prior art.

It is further an object of the present invention to provide a built-in channel offset gate MOS-FET device with good high frequency response.

It is still another object of the present invention to provide a built-in channel offset gate MOS-FET device with a channel length of less than 5 μm.

One embodiment of the invention which achieves these objects comprises an insulating substrate, a semiconductor layer on top of the substrate with two n+-type semiconductor regions separated by an n-type semiconductor region, thick insulation over both n+-type semiconductor regions with an opening in the insulation region over each n+-type semiconductor region for a metal contact, thick insulation over part of the n-type semiconductor region, a notch at least half of which is located in the n-type semiconductor region, and touches the boundary between one n+-type region and the n-type semiconductor region, a metal contact above the notch, and thin insulation between the metal contact and the notch, all of said metal contacts functioning as electrodes.

DESCRIPTION OF AN EXEMPLARY PRIOR ART EMBODIMENT

Figure 1:
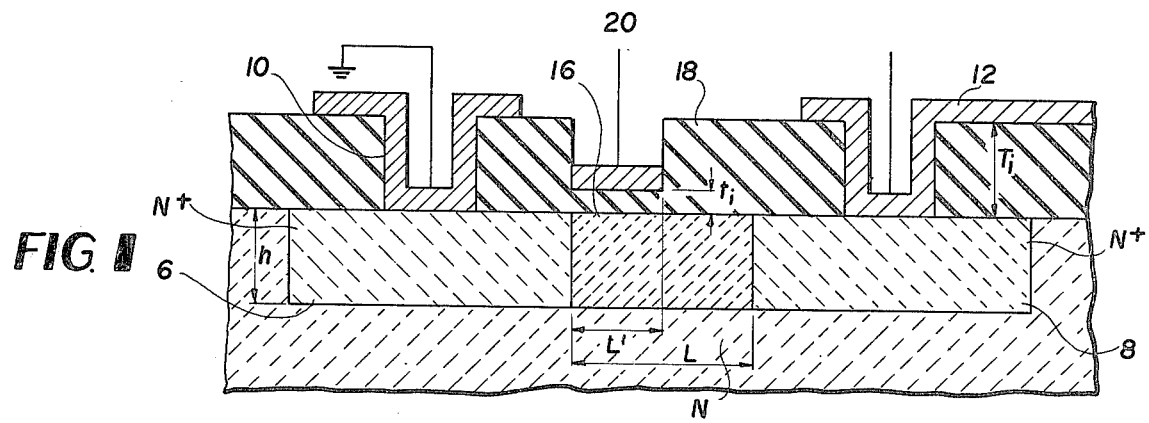
FIG. 1 is a diagrammatic cross section of conventional offset gate built-in channel MOS-FET.

FIG. 1 shows a conventional offset gate built-in channel MOS-FET. An epitaxial n-type semiconductor layer 4 is grown on an insulating substrate 2. Two n+-type semiconductor regions 6,8 are formed at either end of the n-type semiconductor region by a technique such as solid state diffusion. The surfaces of the n+-type semiconductor regions and n-type semiconductor regions are covered by a layer of insulation 18. Openings are made in the insulating layer 18 for electrical contacts to the source 10 and drain 12 regions. part of the surface of the n+-type semiconductor region 4 is covered by an insulating layer 16 thinner than the layer covering the rest of the n-type semiconductor region and the two n+-type semiconductor regions 6 and 8.

The thin layer of insulation 16 which covers part of the surface of the n-type semiconductor is itself covered with metal 20 which functions as an electrode, called the gate electrode.

DETAILED DESCRIPTION OF THE PREFERRED EMBODIMENTS

First Embodiment: Built-in Notched Channel Triode

Figure 2:
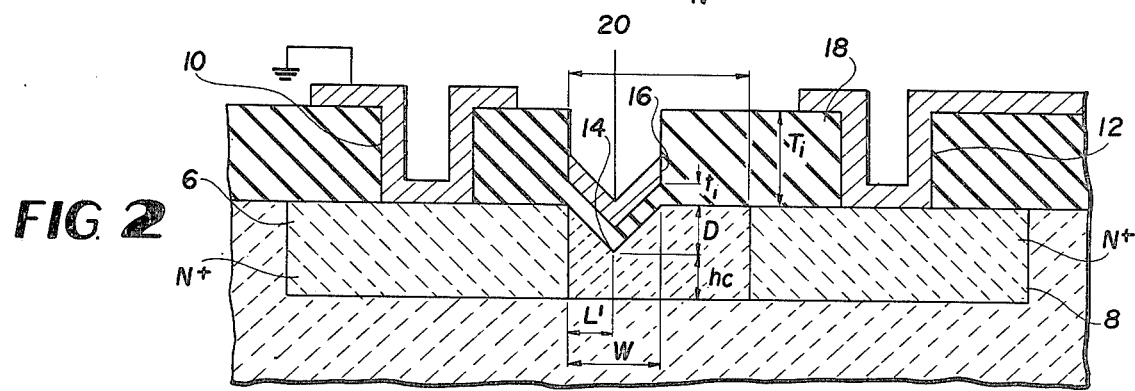
FIG. 2 is a diagrammatic cross section of the built-in notched channel triode.

As shown in FIG. 2, an epitaxial n-type semiconductor layer 4 is grown on an insulating substrate 2. The crystallographic direction of the deposited n-type semiconductor layer 4 is such that controlled etching in the form of notches of V-grooves is possible. For example, if silicon is used as the semiconductor material, the layer 4 must have a crystal orientation <100> which permits the use of the recently developed V-groove technology such as that described in T. J. Rodgers and James D. Meindl "Epitaxial V-groove Bipolar Integrated Circuit Processes" IEEE Trans. in Electron Devices, vol. ED-2D, #3, pp 226-232, 1973 and B. Farzan and C. A. T. Salama "Depletion V-groove MOS (VMOS) Power Transistors," Solid State Electronics, vol. 19, pp 297-306, April 1976. The epitaxial n-type semiconductor layer 4 has a low conductivity. Two highly conductive n+-type semiconductor regions 6,8 are formed at both ends of the n-type semiconductor layer 4 leaving a low conductivity region 4 of length L between them. L, can be, for example, 10 μm. These highly conductive regions 6, 8 are each covered by respective metal layers 10, 12 which function as electrodes. Depending upon the polarity of the applied voltages, these regions are commonly called source 6 and drain 8 where the source is at ground potential and the drain has a positive potential. A notch or groove 14 is etched in the central n-type semiconductor region 4. The notch 14 can be in the shape of a V. The notch 14 is located next to the source 6 boundary. The semiconductor surface of the notch 14 is covered by a thin insulating layer 16 of thickness $t_i$, approximately 1000Å. The rest of the n-type semiconductor surface comprising the central region, and the source 6 and drain regions 8 are covered with a thick insulating layer 18 of thickness $T_i$, approximately 1 μm. Openings are made through the thick insulating layer for making electrical contacts to the source 6 and the drain regions 8. Over the V-notch area 14, which is covered by a thin insulating layer 16, metal is deposited which functions as an electrode commonly called the gate electrode 20. The n-type semiconductor region is called built-in channel. The V-groove 14 is located near the source 6. The minimum width W of the V-groove 14 is determined by the photolithographic process, here assumed to be of the order of 5 μm. A relationship between the depth, D, of the V-groove 14 and the width, W, of the V-groove 14 as given by T. J. Rogers et al in "Epitaxial V-groove Bipolar Integrated Circuit Processes," I.E.E.E. Trans. on Electron Devices, vol. ED-20, #3 pp 226-232, 1973, is $$D/W = 0.7 \quad (1)$$

So that, if we choose W = 5 μm, D = 3.5 μm. Knowing D, we can calculate the thickness h of the epitaxial layer as follows:

$$h = D + h_c \quad (2)$$

where $h_c$ is the critical thickness that still can be depleted completely by applying a negative voltage to the gate. For an n-type semiconductor epitaxial layer with a doping of $N_D = 10^{16} cm^{-3}$, $h_c$ is of the order of 2500 Å, and h then becomes equal to 3.75 μm. $N_D$ may vary from $10^{15}$ cm$^{-3}$ to $10^{17}$ cm$^{-3}$. After the etching of the V-groove 14, a thin oxide layer is grown on the V-notch 14, followed by the formation of a metal layer on the V-groove 14, which functions as the gate contact.

The positioning of the source boundary wth respect to the apex of the notch depends upon the desired channel length. One can envisage two extreme positions:

(a) The source boundary is located at the edge of the notch or, in other words, the apex of the notch is located at a distance W/2 from the boundary of the source region where W = width of the notch, as pictured in FIG. 2.

Figure 13:
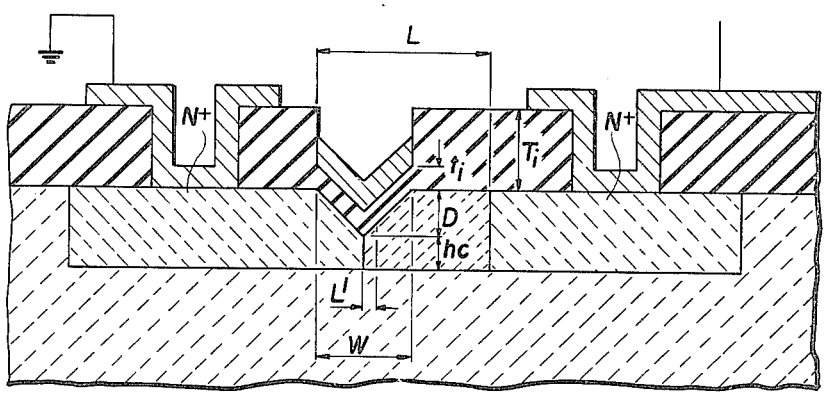
FIG. 13 is a diagrammatic cross section of the built-in notched channel triode with the apex of the notch at the source boundary.

(b) The source boundary is located at the apex of the notch as depicted in FIG. 13.

Figure 14:
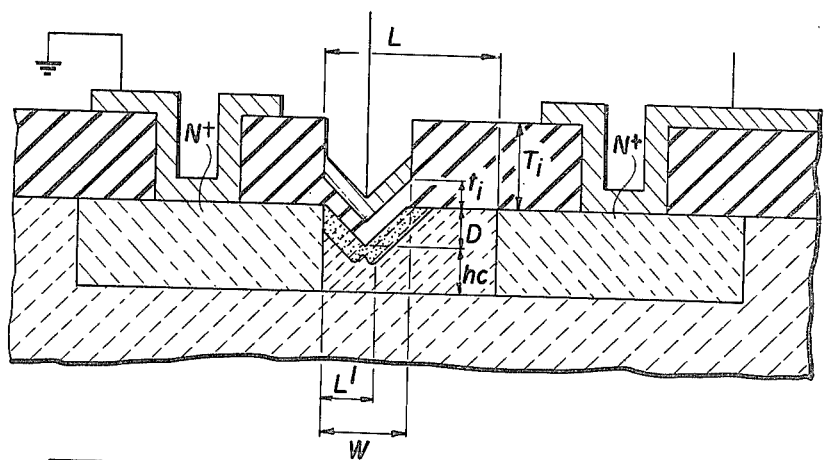
FIG. 14 is a diagrammatic cross section of the built-in notched channel triode showing the depletion zone with a double maximum on either side of the apex of the notch.

Farzan et al. have shown that the maximum of the width of the depletion zone does not occur under the apex but that, under zero current condition, there exists a double maximum, one to the left and the other to the right of the apex, as schematically shown in the speckled portion in FIG. 14. When a positive drain voltage is applied so that a current flows along the channel, the depletion maximum at the right of the apex (situated from the farthest from the source boundary) increases and defines the location where the channel pinch-off occurs, as shown schematically in the speckled region in FIG. 15. From this simple picture it can be seen that by placing the source boundary at the apex of the notch it is, in principle, still possible to deplete the channel.

Figure 15:
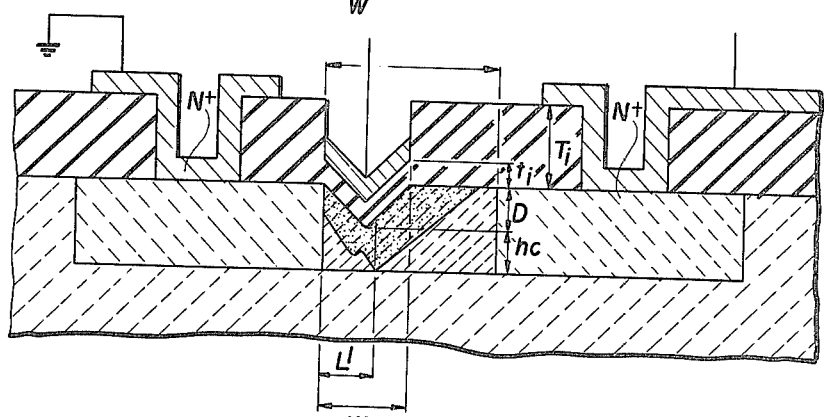
FIG. 15 is a diagrammatic cross section of the built-in notched channel triode showing where the channel pinch-off occurs when a positive drain voltage is applied.

The effective channel length, L′, is given, in essence, by the distance between the source boundary and the maximum of the depletion width. For a prior art device depicted in FIG. 1 the depletion region, created by applying a negative gate voltage $V_G$ and a positive drain voltage, will exist in the n channel over a length equal to L′. For large enough voltages, the channel pinches off at the end of the gate opposite the source boundary. For the present embodiment with a notched channel this pinch-off point is at a short distance beyond the apex location as shown in FIG. 15.

This embodiment of the built-in notched channel triode will have an effective channel length of approximately half of the channel length of the conventional offset gate built-in channel MOS-FET devices. To understand the importance of having a short effective channel length in a high frequency device, the relationship between the unity current gain frequency and the effective channel length must be understood.

The unity current gain frequency is defined as follows:

$$f_t = g_m/2\pi C_g$$

where $g_m$, the transconductance is proportional to 1/L′ and $C_g$, the input gate capacitance is proportional to L the length of the n-type semiconductor region. So that as a simple design rule one may say that $$f_t \propto 1/L'^2$$

where L' is the effective channel length. When L' is reduced to a value approaching 1 μm or less, the transconductance tends to saturate to a constant value due to carrier limiting velocity $V_{limit}$. Under this conditions $f_t$ becomes $$f_t = V_{Limit} 2\pi L'.$$

The present embodiment has a unity current gain frequency of four times the conventional offset gate built-in channel MOS-FET devices. From the above expression the importance can be seen of having a short effective channel device if a high frequency device is desired.

The use of a p-type semiconductor layer between two p+-type semiconductor regions is also feasible. However higher frequency devices are obtained using a n-type layer between two n+-type regions due to the fact that the mobility of electrons (majority carriers in the n-type layer device) is larger than the mobility of holes (majority carriers in the p-type layer device).

Second Embodiment: Built-In Notched Channel Triode with Half Metallized Notch

Figure 3:
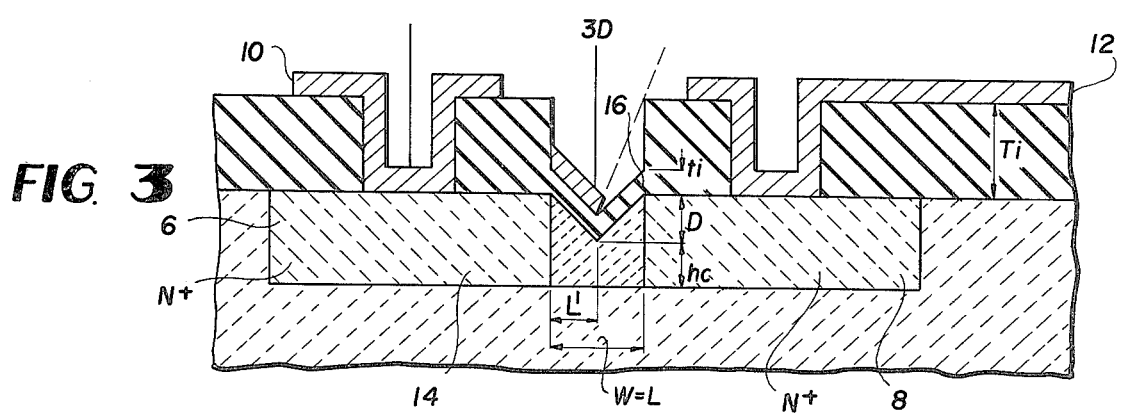
FIG. 3 is a diagrammatic cross section of the built-in notched channel triode with gate partially metallized.

The drain resistance can be minimized by using a special evaporation technique known in the art so that only one side of the notch 14 is metallized. By doing so the central area between the source 6 and drain 8 can be reduced to be of the order of 5 μm. The effective length L' of the channel will be somewhat smaller than in the first embodiment, so that the unity current gain frequency is somewhat increased. In addition, the total device area is greatly reduced. The schematic cross section of the device structure is shown in FIG. 3.

Figure 6:
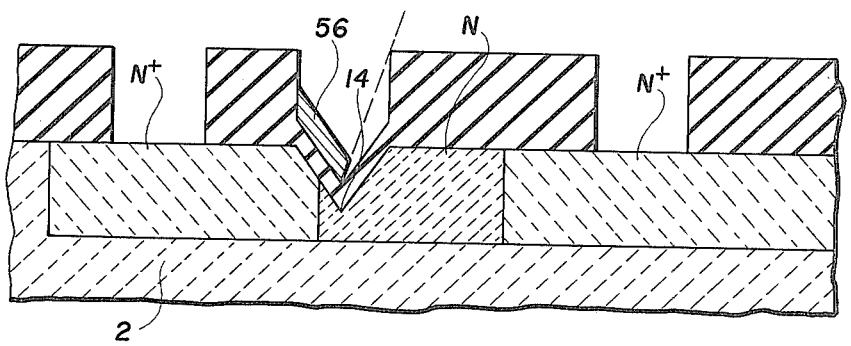
FIG. 6 is a diagrammatic cross section of the built-in notched channel triode with partially metallized gate, overlapping into an n+-type semiconductor region.

The special evaporation technique can consist of, for example, orienting the substrate 2 at an angle with respect to the incident metal particles, to produce a notch 14 metallized, on only one side 56, as shown in FIG. 6.

Figure 4:
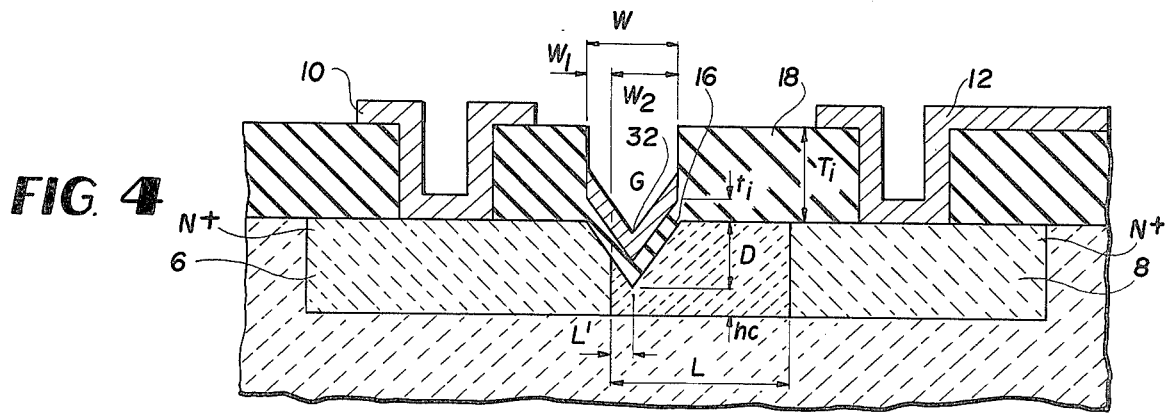
FIG. 4 is a diagrammatic cross section of the built-in notched channel triode which overlaps into an n+-type semiconductor region.

Third Embodiment: Built-In Notched Channel Triode Partially Overlapping Source Region The effective channel length, L', of the built-in notched channel triode can be adjusted precisely by letting one side of the V-notch 14 partially overlap the n+-semiconductor region 6 as shown in FIG. 4. As indicated in FIG. 4, the width of the channel under the notch 14 can be separated into two parts. one part having a width of $W_1$ overlaps the source region 6, and another part having a length $W_2$ is located over the n-type semiconductor central region so that $$W = W_1 + W_2 \tag{4}.$$

The effective channel length of the built-in notched channel triode, L', can in principle be varied from 0 to W/2, by varying $W_1$ between the limits of W/2 and 0. This variation of $W_1$ can be achieved by precise mask alignment procedures. In this way, effective channel lengths of the order of 1 μm or less can be obtained. In other words, the unity current gain frequency is increased with respect to the conventional offset gate built-in channel MOS-FET, by a large factor of 30.

Figure 5A:
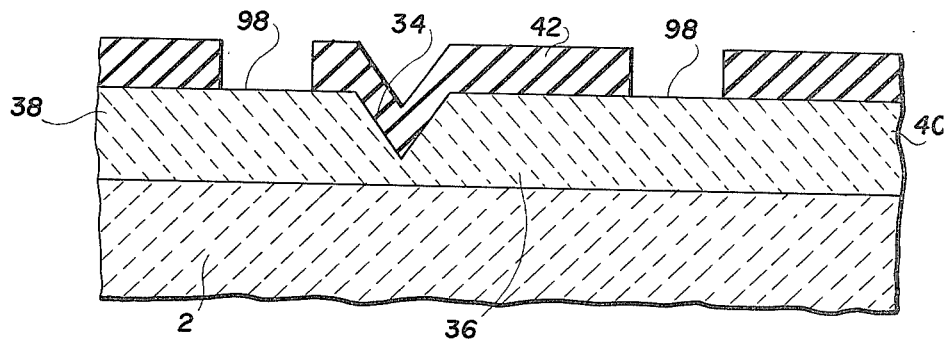
FIG. 5a is a diagrammatic cross section of the notched n-type semiconductor layer on an insulating substrate.
Figure 5B:
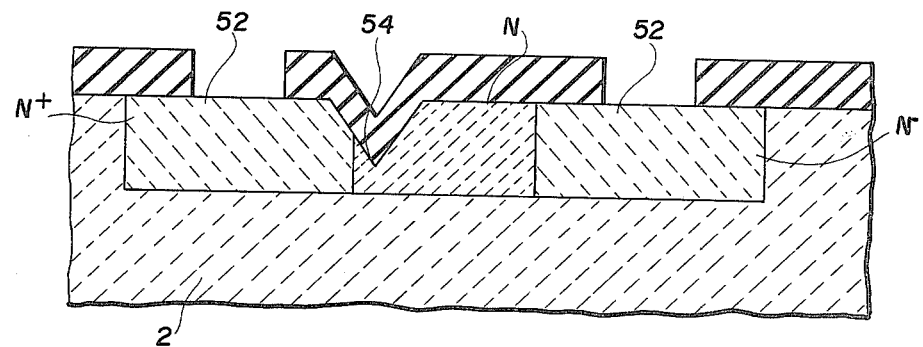
FIG. 5b is a diagrammatic cross section of a notched n-type semiconductor layer on an insulating substrate with source and drain n+-regions.

Another method for fabricating a built-in notched channel triode which partially overlaps the source region 6 is as follows. As shown in FIG. 5a, a notch 34 has been etched prior to the solid-state diffusion of the n-type semiconductor region 36 to form $n^{30}$-semiconductor regions of the source 38 and drain 40. The notch 34 and the n-type semiconductor layer 36 are covered with an insulating layer 42 which is opaque to the solid-state diffusion of impurities. Openings 98 are etched in the insulating layer 42 and the n+-regions are then fabricated by diffusing appropriate dopants through the openings in the insulating layer. FIG. 5b shows the notch 54 overlapping the n+-type semiconductor region 52. This fabrication method differs from the one used in the previously described structures, where the n+-regions are fabricated prior to the etching of the notch.

Figure 7:
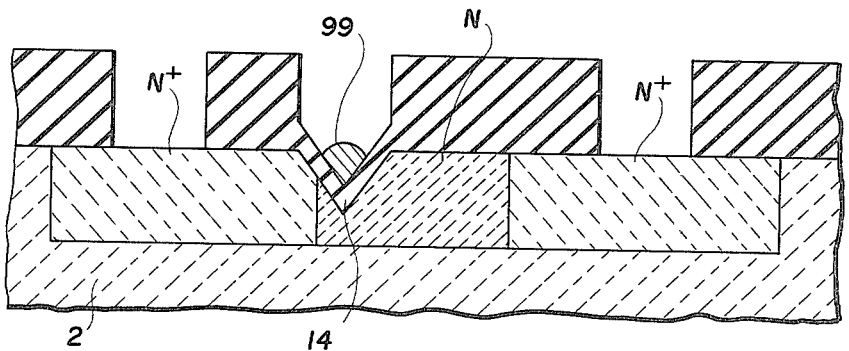
FIG. 7 is a diagrammatic cross section of the built-in notched channel triode with the bottom part of notch metallized and which overlaps into n+-type semiconductor region.

The metallization of the gate contact can be done by the oblique evaporation scheme as explained under the second embodiment, and as indicated schematically in FIG. 6. As an alternative, a conventional metallization can be performed followed by a special etch technique so that only the bottom part of the notch 14 remains filled with metal 99, as shown schematically in FIG. 7. The drain resistance of a notched channel triode with only the bottom part of the notch 14 filled with metal is expected to be smaller than that of the first embodiment discussed. This occurs due to the reduced channel length modulation effects in the former case.

Fourth Embodiment: Built-In Flat Bottom Notched Channel Triode

Figure 8:
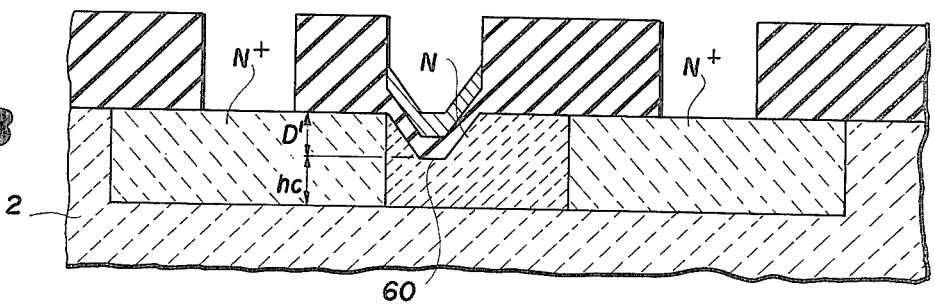
FIG. 8 is a diagrammatic cross section of the built-in flat bottom notched channel triode.
Figure 9:
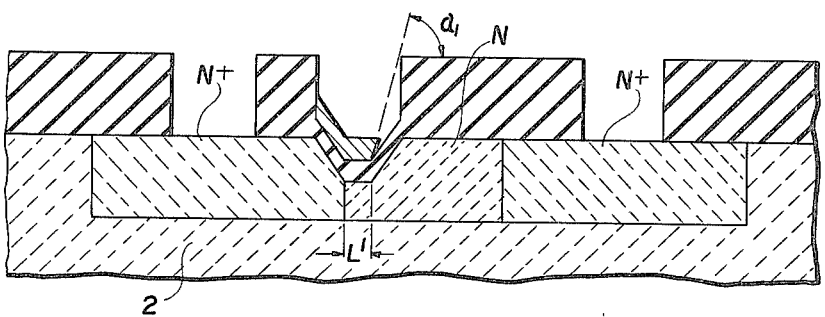
FIG. 9 is a diagrammatic cross section of the built-in flat bottom notched channel with a partially metallized notch.
Figure 10:
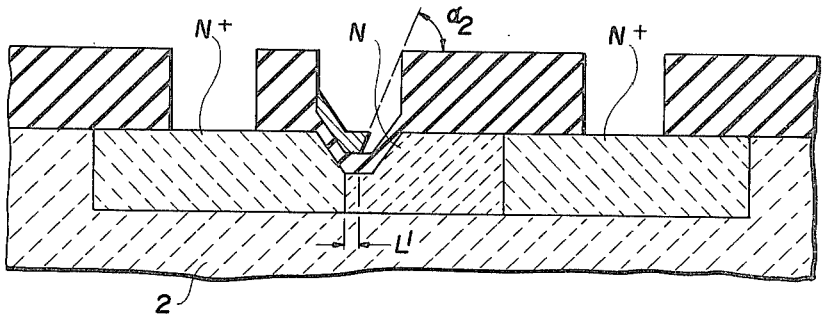
FIG. 10 is a diagrammatic cross section of the built-in flat bottom notched channel triode with a partially metallized notch.
Figure 11:
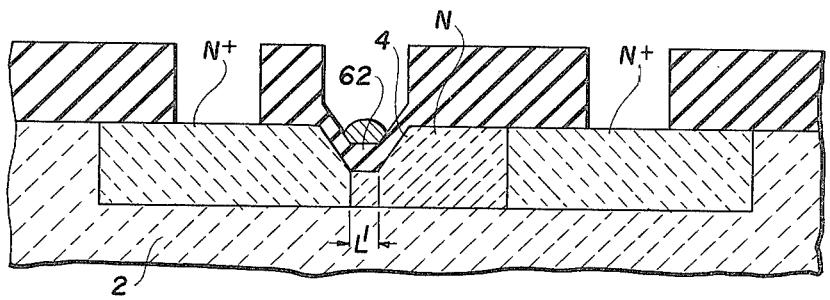
FIG. 11 is a diagrammatic cross section of the built-in flat bottom notched channel triode with the bottom part of the notch metallized.

Instead of etching the notch 60 to its completion one can stop the etching process and obtain a built-in flat bottom notched channel triode:

Three types of metallization schemes can be used, such as:

1. Conventional metallization of the whole notched region 60, as shown in FIG. 8.
2. The oblique evaporation technique with varying angle of incidence $\alpha_1, \alpha_2$ for obtaining partially metallized flat bottom notches with different effective channel lengths, as shown in FIG. 9 and 10 respectively.
3. A repetitive metallization and etching scheme to cover only the flat bottom part of the notch 62 as shown in FIG. 11.

A combination of these new features with one or a combination of the features described in the previous structures can be easily accomplished. An example is shown in FIG. 11 where a built-in flat bottom notched channel triode which overlaps onto a n+-type semiconductor region is depicted, i.e. a combination of embodiments 3 and 4.

For the built-in flat bottom notched channel triode the thickness of the epitaxial layer 4 is given by $$h = D' + h_c \tag{5}$$

where D' is the new depth of the notch, which is a function of the etching time in the silicon V-groove technology.

Fifth Embodiment: Built-In Notched Channel Triodes on a non-Insulating Substrate When it is necessary to incorporate a high frequency device in an integrated circuit made, for example, on a silicon substrate instead of an insulating substrate, the structures described previously can be so modified. An epitaxial n-type semiconductor layer can be grown on a p-type substrate or vice-versa. These devices have a better high frequency response than previously described devices due to the additional drain-substrate depletion region capacitance. In addition, the channel-substrate depletion region will modulate the channel thickness in a similar way as the surface depletion region by the gate voltage.

Figure 12:
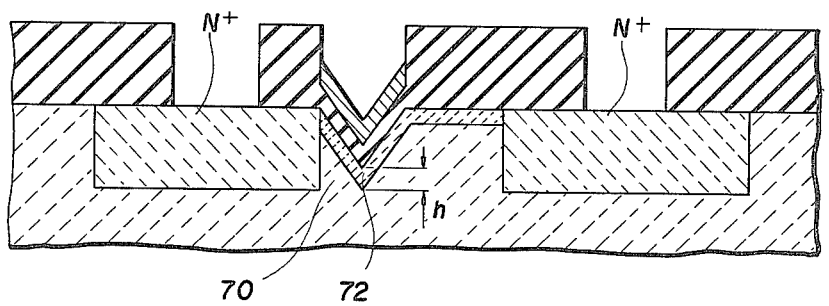
FIG. 12 is a diagrammatic cross section of the ion-implanted notched channel triode.

It is also possible now to use ion implantation as an alternative technology to epitaxial growth technique for fabricating the built-in channel as shown schematically in FIG. 12.

In case of an epitaxial built-in channel, the thickness of the epitaxial layer 70 is now given by the following expression:

$$H = D + h_c + h_o \quad (6)$$

where $h_o$ is the substrate-channel depletion width extending into the built-in channel for zero drain-source voltage. In case of an ion implanted built-in channel, the thickness of the ion implanted layer 72 is given by $$h = h_c + h_o \quad (7)$$

Sixth Embodiment: The Built-In Notched Channel Schottky Barrier Gate Triodes

In the previous structures a thin oxide layer in grown prior to metallization. However, this step can be eliminated as indicated below.

Figure 16:
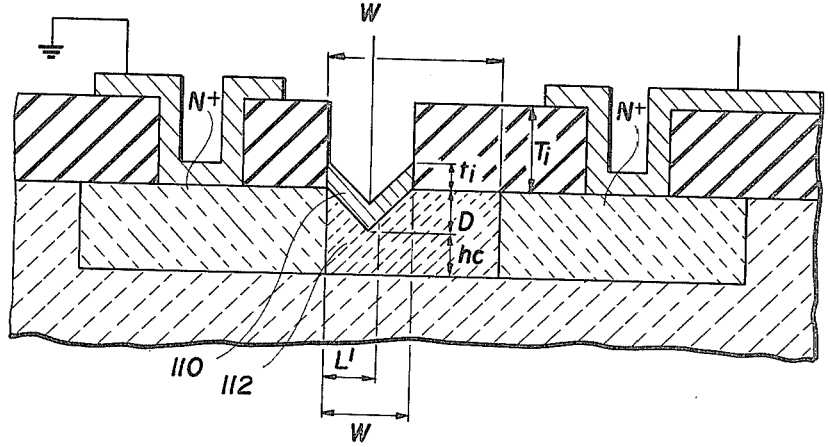
FIG. 16 is a diagrammatic cross section of a built-in notched channel triode with a Schottky Barrier Gate.

The notched gate area can be metallized 110 directly onto the central n-type semiconductor channel region 112, between the source and the drain, provided the channel conductivity is low or moderately high, thus resulting in a metal-semi-conductor or a Schottky Barrier Gate as shown in FIG. 16. The operation of the device is similar to that of the J-FET.

Seventh Embodiment: The Built-In Notched Channel Semiconductor Gate Triode

Figure 17:
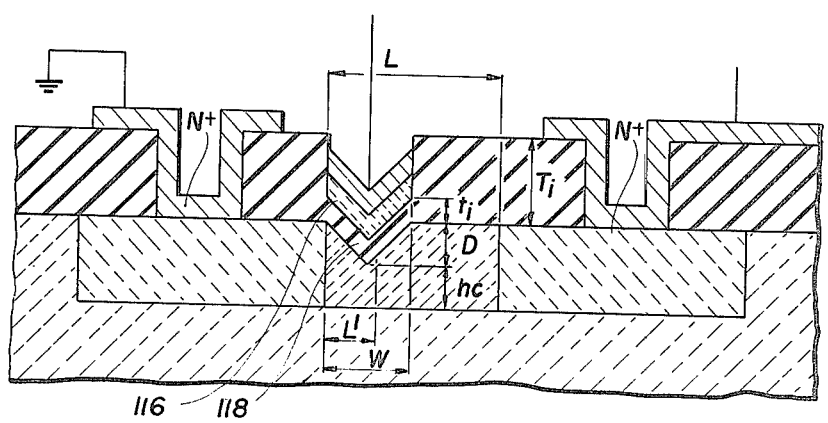
FIG. 17 is a diagrammatic cross section of a built-in notched channel triode having a semiconductor layer instead of a metal layer over the gate region.

Embodiments 1-5 can be modified by using a semiconductor layer 116 instead of a metal layer over the thin oxide of the gate region 118 as shown in FIG. 17.

A series of built-in notched channel device structures and methods of their fabrication have been described. These devices can be part of an integrated circuit, such as a high frequency amplifier, or can be used as a discrete device.

By using the embodiments previously described, one or more of the following features can be controlled: the input capacitance, the built-in channel conductivity, the pinch-off voltage, the effective channel length and the drain series resistance. In addition, the devices here described have a lower drain series resistance, and less channel modulation than the conventional offset gate built-in channel MOS-FET's.

It will be obvious to those skilled in the art, that various changes may be made without departing from the scope of the invention, and the invention is not to be considered limited to what is shown in the drawings and described in the specification.

What is claimed is:

1. A built-in notched channel MOS-FET triode for high frequency application comprising:
    an insulating substrate;
    semiconductor material covering at least a portion of a surface of said substrate, said semiconductor material including two highly doped regions of a given type of conductivity free of contact with one another;
    a region of the given conductivity type disposed between said two highly doped regions, a notch extending through the surface of said semiconductor material, the width of said notch being less than the width of said semiconductor region of the given conductivity type where width is measured along an axis perpendicular to the boundary between a highly doped semiconductor region and the region of given conductivity, said notch being disposed so that at least half of the width of said notch is in the region of given conductivity and said notch touches the boundary between one of said highly doped semiconductor regions and said region of given conductivity;
    a first metal layer, covering at least some part of said notch;
    insulating material of thickness $T_i$ covering the top surface of said semiconductor material, except the area over said notch, said insulating material having an opening over each highly doped semiconductor region, and having a thickness of $t_i$ over said notch, said insulating material of thickness $t_i$ being disposed between sai notch and said first metal layer, and $T_i \gg t_i$; and
    a second metal layer disposed in the opening in said insulating material which covers each highly doped semiconductor region, said metal layer functioning as an electrode.

2. A built-in notched channel MOS-FET triode for high frequency application in accordance with claim 1, wherein said notch is V-shaped.

3. A built-in notched channel MOS-FET triode for high frequency application in accordance with claim 2, wherein the width of said notch is 5 μm and the depth of said notch is 3.5 μm.

4. A built-in notched channel MOS-FET triode for high frequency application in accordance with claim 1, wherein $t_i$ is approximately 1000 Å and $T_i$ is approximately 1 μm.

5. A built-in notched channel MOS-FET triode for high frequency application in accordance with claim 1, further including a metal oxide layer disposed over said notch between said insulating material and said metal layer.

6. A built-in notched channel MOS-FET triode for high frequency application in accordance with claim 1, wherein said two highly doped regions of the same conductivity are n+-type semiconductor regions and said region of given type of conductivity of an n-type semiconductor region.

7. A built-in notched channel MOS-FET triode for high frequency application in accordance with claim 5, wherein said doping levels of said n+-type semiconductor region vary from $10^{15}$ cm$^{-3}$ to $10^{17}$ cm$^{-3}$.

8. A built-in notched channel MOS-FET triode for high frequency application in accordance with claim 1, wherein said two highly doped regions of the same conductivity are p+-type semiconductor regions and said layer of given type of conductivity is a p-type semiconductor region.

9. A built-in notched channel MOS-FET triode for high frequency application in accordance with claim 1, wherein the n+-type semiconductor region which touches said notch is at ground potential and the other n+-type semiconductor region is at a positive potential.

10. A built-in notched channel MOS-FET triode for high frequency application in accordance with claim 2, wherein said semiconductor material has a crystal orientation <100>.

11. A built-in notched channel MOS-FET triode for high frequency application in accordance with claim 1, wherein said notch has a flat bottom.

12. A built-in notched channel MOS-FET triode for high frequency application in accordance with claim 1, wherein the entire area of said notch is covered by said first metal layer.

13. A built-in notched channel MOS-FET triode for high frequency application in accordance with claim 2, wherein one leg of said V-notch is covered with said first metal layer.

14. A built-in notched channel MOS-FET triode for high frequency application comprising:
- a semiconductor substrate of one type of conductivity;
- semiconductor material covering at least a portion of a surface of said substrate of opposite conductivity from said substrate, said semiconductor material including:
- two highly doped regions free of contact with one another,
- a region of the given conductivity type disposed between said two highly doped regions, a notch extending through the surface of said semiconductor material, the width of said notch being less than the width of said region of given conductivity, where width is measured along an axis is perpendicular to the boundary between one of said highly doped semiconductor regions and said region of given conductivity, said notch being disposed so that at least half of the width of said notch is in the region of given conductivity and said notch touches the boundary between one of said highly doped semiconductor regions and said region of given conductivity;
- a first metal layer, covering at least some part of said notch;
- insulating material of thickness $T_i$ covering the top surface of said semiconductor material, except the area over said notch, said insulating material having an opening over each highly doped semiconductor region, and having a thickness of $t_i$ over said notch, said insulating material of thickness $t_i$ being disposed between said notch and said first metal layer, and $T_i >> t_i$; and
- a second metal layer disposed in the opening in said insulating material which covers each highly doped semiconductor region.

15. A build-in notched channel MOS-FET triode for high frequency application in accordance with claim 14, wherein said notch is V-shaped.

16. A built-in notched channel MOS-FET triode for high frequency application comprising:
- an insulating substrate;
- first semiconductor material covering at least a portion of a surface of said substrate, said semiconductor material including:
- two highly doped regions of a given type of conductivity free from contact with one another,
- a region of the given conductivity type disposed between said two highly doped regions, a notch extending through the surface of said semiconductor material, the width of said notch being less than the width of said semiconductor region of the given conductivity type where width is measured along an axis perpendicular to the boundary between one of said highly doped semiconductor regions and said region of given conductivity, said notch being disposed so that at least half of the width of said notch is in the region of given conductivity and said notch touches the boundary between one of said highly doped semiconductor regions and the region of given conductivity;
- a second semiconductor material, covering at least some part of said notch;
- insulating material of thickness $T_i$ covering the top surface of said semiconductor material except the area over the notch, said insulating material having an opening over each highly doped semiconductor region, and having a thickness $t_i$ over said notch, said insulating material of thickness $t_i$ being disposed between said notch and said second semiconductor material, and $T_i >> t_i$; and
- a metal layer disposed in the openings in said insulating material which covers each highly doped semiconductor region.

17. A built-in notched channel MOS-FET triode for high frequency application in accordance with claim 16, wherein said notch is V-shaped.

18. A built-in notched channel MOS-FET triode for high frequency application comprising:
- an insulating substrate;
- semiconductor material covering at least a portion of a surface of said substrate, said semiconductor material including:
- two highly doped regions of a given type of conductivity free from contact with one another,
- a region of the given conductivity type disposed between said two highly doped regions, a notch extending through the surface of said semiconductor material, the width of said notch being less than the width of said semiconductor region of the given conductivity type where width is measured along an axis perpendicular to the boundary between a highly doped semiconductor region and the region of given conductivity, said notch being disposed so that at least half of the width of said notch is in the region of given conductivity and said notch touches the boundary between one of said highly doped semiconductor regions and said region of given conductivity;
- a first metal layer, covering at least some part of said notch of thickness $t_i$;
- insulating material of thickness $T_i$ covering the top surface of said semiconductor material except the area over said notch, said insulating material having an opening over each highly doped semiconductor region, where $T_i >> t_i$; and
- a second metal layer disposed in the opening in said insulating material which covers each highly doped semiconductor region, said metal layer functioning as an electrode.

19. A built-in notched channel MOS-FET triode for high frequency application in accordance with claim 18, wherein said notch is V-shaped.

* * * * *